United States Patent [19]

Scott

[11] 4,449,187

[45] May 15, 1984

[54] DEVICE FOR INDIRECTLY MONITORING CUMULATIVE COST OF UTILITY CONSUMPTION

[76] Inventor: Charles F. Scott, 441 Beach St., Middleport, Ohio 45706

[21] Appl. No.: 403,721

[22] Filed: Jul. 30, 1982

[51] Int. Cl.³ .............................................. G06F 15/20
[52] U.S. Cl. ..................................... 364/464; 364/709
[58] Field of Search ............... 364/464, 483, 709, 715; 324/113–116, 142; 377/19, 20

[56] References Cited

U.S. PATENT DOCUMENTS

| | | | |
|---|---|---|---|
| 3,683,343 | 8/1972 | Feldman et al. ..................... | 324/116 |
| 3,998,093 | 12/1976 | Bertolasi .............................. | 364/483 |
| 4,080,568 | 3/1978 | Funk .................................... | 364/483 |
| 4,106,095 | 8/1978 | Yarbrough ........................... | 364/464 |
| 4,120,031 | 10/1978 | Kincheloe et al. ................. | 364/464 |
| 4,207,557 | 6/1980 | Gilkeson et al. ................... | 364/483 |
| 4,229,795 | 10/1980 | Vieweg et al. ...................... | 364/483 |
| 4,233,590 | 11/1980 | Gilkeson et al. ................... | 364/483 |
| 4,253,151 | 2/1981 | Bouve ................................. | 364/483 |
| 4,261,037 | 4/1981 | Hicks .................................. | 364/483 |

Primary Examiner—Errol A. Krass
Attorney, Agent, or Firm—Finnegan, Henderson, Farabow, Garrett & Dunner

[57] ABSTRACT

An electromechanical device for indirectly monitoring consumption of a utility in the home or commercial environment, using a clock to measure the time of operation of the utility consuming device and a calculator to convert the measured time into a cumulative monetary figure denoting the cost of the utility consumed.

1 Claim, 3 Drawing Figures

4,449,187

DEVICE FOR INDIRECTLY MONITORING CUMULATIVE COST OF UTILITY CONSUMPTION

BACKGROUND OF THE INVENTION

1. Field of the Invention

This invention relates to devices which monitor and keep a running account of the cost of consumption of a particular utility in a home or commercial environment.

2. Description of the Prior Art

There are many devices which measure fuel consumption by direct measurement of the flow of fuel being consumed. These devices employ fuel flow meters (the specific type being dependent upon the particular utility being measured) in conjunction with various oscillating circuits responsive to the flow of fuel through the metering device and electronic microprocessing circuitry for calculating the flow of fuel measured at the meter. The majority of these devices, in the electrical arts for example, are devoted to monitoring the consumption of electric power by direct metering of the current being consumed. The circuitry employed by the prior art is complex, expensive, and not easily repairable without replacing more than the discrete circuit element at fault. Moreover, the prior art is concerned with directly metering the quantity of the utility being consumed, rather than correlating the cost of utility consumption with the period of time during which the utility consumption apparatus consumes the utility being monitored.

It is therefore the principal object of this invention to provide a simple device for monitoring the cost of consumption of a specific utility without directly metering the utility being consumed, and thereby to encourage energy conservation measures in the home and office environments.

SUMMARY OF THE INVENTION

The object of this invention is accomplished, in conjunction with a utility consumption apparatus having an ON/OFF switch controlling the consumption of the utility, by a device for indirectly monitoring and displaying the cumulative cost of the utility consumed by the utility consumption apparatus without physically measuring the utility consumed by the apparatus comprising an electric clock having a face, a minute hand, an electrical contact brush located on the minute hand, an electric motor for moving the minute hand, and electrical contact surfaces on the face for forming a calculation triggering switch with the electrical contact brush; an AC to DC transformer for connecting the electric motor of the clock and the ON/OFF switch for advancing the minute hand only when the utility consumption apparatus is operating to consume the utility to be monitored; constant addend calculation means having a memory for storing a cumulative total and a constant monetary increment, an equals function for adding the constant rate factor to the cumulative total, an equals switch for activating the addition circuit, and display means; and a first electrical circuit including the electrical contact brush and the electrical contact surfaces for short circuiting the equals switch and activating the addition circuit to calculate the sum of the constant monetary increment and the cumulative total, to display the sum and to replace the cumulative total in the memory with the sum.

BRIEF DESCRIPTION OF THE DRAWINGS

The accompanying drawings, which are incorporated in and constitute a part of this specification, illustrate one embodiment of the invention and, together with the description, serve to explain the principles of the invention.

DESCRIPTION OF THE PREFERRED EMBODIMENT

Reference will now be made in detail to the present preferred embodiment of the invention, an example of which is illustrated in the accompanying drawings as here embodied for use with a gas or oil home heating furnace.

Figure 1:
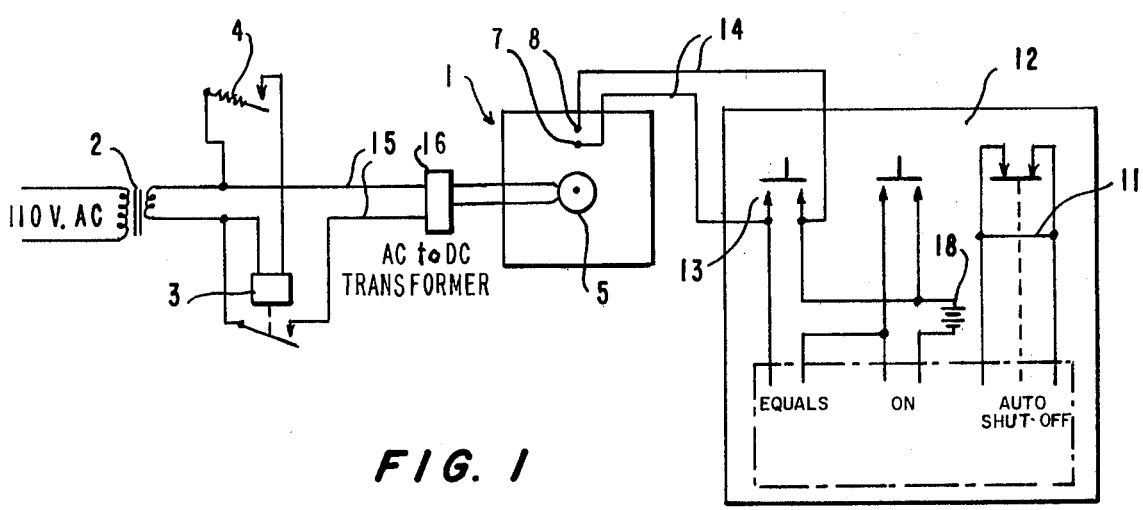
FIG. 1 is a block and wiring diagram of a utility consumption monitoring device constructed in accordance with the present invention showing the back view of the clock.

As known in the art, a gas or oil heating furnace typically employs a 110 volt AC to 24 volt AC transformer 2 in conjunction with a relay 3 and a 24 volt AC thermostat 4 as shown in FIG. 1. Relay 3 comprises an ON/OFF switch for controlling the consumption of the utility.

Figure 2:
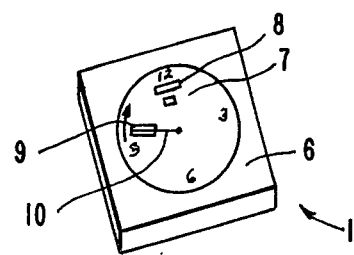
FIG. 2 is a perspective front view of the clock used in the device of FIG. 1 and showing the clock face.
Figure 3:
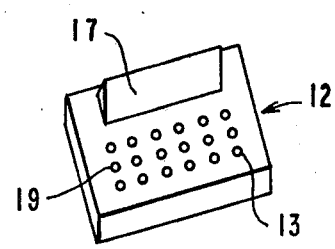
FIG. 3 is a perspective front view of the calculator used in the device of FIG. 1 and showing the calculator display.

In accordance with the invention, a device for indirectly monitoring and displaying the cumulative cost of the utility consumed by an utility consumption apparatus having an ON/OFF switch controlling the consumption of the utility is provided, comprising: an electric clock having a face, a minute hand, an electrical contact brush located on the minute hand, an electric motor for moving the minute hand, electrical contact surfaces on the face for forming a calculation triggering switch with the electrical contact brush; an AC to DC transformer for connecting the electric motor and the ON/OFF switch for advancing the minute hand only when the utility consumption apparatus is operating to consume the utility to be monitored; constant addend calculation means having a memory for storing a cumulative total and a constant monetary increment, an equals function for adding the constant monetary increment to the cumulative total, an equals switch for activating the addition circuit, and display means; and a first electrical circuit including the electrical contact brush and the electrical contact surfaces for short circuiting the equals switch and activating the addition circuit to calculate the sum of the constant monetary increment and the cumulative total, to display the sum and to replace the cumulative total in the memory with the sum. As embodied herein, an electric clock, indicated generally as 1, has been modified and a 24 volt AC to 1.5 volt DC converter 16 is connected into series circuit 15 including relay 3, 110 volt to 24 volt AC transformer 2 and clock motor 5. It is to be understood that AC-DC converter 16 may be any one of several well-known designs capable of transforming an AC voltage to a DC voltage, such as a transformer with its primary winding connected to series circuit 15 and its secondary winding coupled through a full wave bridge rectifier to clock 1. As shown in FIG. 2, clock face 6 contains two electrically conducting contact points 7 and 8. Electrically conducting contact brush 9 is attached to the end of minute hand 10 of the clock for closing a circuit between contact points 7 and 8 by electrically connecting these points.

As embodied herein, the constant addend calculation means includes a battery operated hand-held electronic calculator of the constant factor type. Bypass wire 11 is inserted into constant addend electronic calculator 12 to bypass the automatic shutoff of the calculator. The calculator has display means 17 and direct curent power supply 18.

As embodied herein, the display means includes a light emitting diode display of the type commonly found in hand-held electronic calculators. The addition circuit of the calculator is represented in FIG. 1 by the portion labeled "EQUALS". Closing equals switch 13, of a type commonly found in hand-held battery operated electronic calculators, energizes the addition circuit on calculator 12, which forms part of series circuit 14 with clock face contact points 7 and 8.

In accordance with the invention, movement of contact brush 9 across contact points 7 and 8 on the face of the clock closes circuit 14 to short circuit equals switch 13 on calculator 12. Short circuiting equals switch 13 energizes the addition circuit and causes calculator 12 to add a constant monetary increment previously placed in memory to the amount showing on display 17 from the previous calculation for each hour of running time of the fuel consumption apparatus. The new total appears on display 17.

Calculator 12 is of the well-known constant addend type which adds in cumulative fashion an addend stored in the calculator memory to a total representing the sum of the next previous addition performed by the calculator. The constant monetary increment can represent, for example, the unit cost per hour of the fuel consumed by the fuel consumption device. The stored addend might also represent one hour for the time during which the fuel consumption device was operating. As is well-known in the calculator art, the constant addend can be cancelled from memory and a new constant addend lodged in memory by the conventional numeric keys 19.

It will be apparent to those skilled in the art that various modifications and variations can be made in the fuel consumption monitor of the present invention without departing from the scope or the spirit of the invention. Thus, it is intended that the present invention cover the modifications and variations of this invention provided they come within the scope of the appended claim and its equivalents.

What is claimed is:

1. In conjunction with a utility consumption apparatus having an ON/OFF switch controlling the consumption of the utility, a device for indirectly monitoring and displaying the cumulative cost of the utility consumed by said apparatus without physically measuring the utility consumed by said apparatus, comprising:

an electrical clock having a face, a minute hand, an electrical contact brush located on said minute hand, an electric motor for moving said minute hand, and electrical contact surfaces on said face for forming a calculation triggering switch with said electrical contact brush;

an AC to DC transformer for connecting said electric motor and said ON/OFF switch for advancing said minute hand only when said utility consumption apparatus is operating to consume the utility to be monitored;

constant addend calculation means having a memory for storing a cumulative total and a constant monetary increment, an addition circuit for adding said constant monetary increment to said cumulative total, an equals switch for activating said addition circuit, and display means; and a first electrical circuit including said electrical contact brush and said electrical contact surfaces for short circuiting said equals switch and activating said addition circuit to calculate the sum of said constant monetary increment and said cumulative total, to display said sum and to replace said cumulative total in said memory with said sum.

* * * * *